United States Patent
Arsovski

(10) Patent No.: US 9,269,440 B2
(45) Date of Patent: Feb. 23, 2016

(54) HIGH DENSITY SEARCH ENGINE

(71) Applicant: INTERNATIONAL BUSINESS MACHINES CORPORATION, Armonk, NY (US)

(72) Inventor: Igor Arsovski, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 99 days.

(21) Appl. No.: 14/280,130

(22) Filed: May 16, 2014

(65) Prior Publication Data

US 2015/0332767 A1 Nov. 19, 2015

(51) Int. Cl.
G11C 15/00 (2006.01)
G11C 15/04 (2006.01)
G11C 11/417 (2006.01)

(52) U.S. Cl.
CPC .............. *G11C 15/04* (2013.01); *G11C 11/417* (2013.01)

(58) Field of Classification Search
CPC ....... G11C 15/04; G11C 15/00; G11C 15/046
USPC ............... 365/49.17, 49.15, 49.16, 189.07
See application file for complete search history.

(56) References Cited

U.S. PATENT DOCUMENTS

| | | | |
|---|---|---|---|
| 3,465,303 A | | 9/1969 | Koerner |
| 7,057,913 B2 * | | 6/2006 | Hsu et al. ............... G11C 15/04 365/49.1 |
| 7,259,979 B2 | | 8/2007 | Sachan et al. |
| 7,382,637 B1 * | | 6/2008 | Rathnavelu ............ G11C 15/00 365/49.17 |
| 7,701,252 B1 | | 4/2010 | Chow et al. |
| 7,936,622 B2 | | 5/2011 | Li et al. |
| 2013/0058145 A1 | | 3/2013 | Yu et al. |
| 2013/0076950 A1 | | 3/2013 | Eshraghian et al. |
| 2013/0083612 A1 | | 4/2013 | Son et al. |
| 2013/0111122 A1 | | 5/2013 | Song et al. |

FOREIGN PATENT DOCUMENTS

EP 0459703 12/1991

OTHER PUBLICATIONS

Davis et al., "Application Exploration for 3-D Integrated Circuits: TCAM, FIFO, and FFT Case Studies", IEEE Transactions on Very Large Scale Integration (VLSI) Systems, vol. 17, No. 4, Apr. 2009, pp. 496-506.

Marinissen, Erik J., "Challenges in Testing TSV-Based 3D Stacked ICs: Test Flows, Test Contents, and Test Access", IEEE, 2010, pp. 544-547.

(Continued)

*Primary Examiner* — Son Dinh

(74) *Attorney, Agent, or Firm* — Steven Meyers; Andrew M. Calderon; Roberts Mlotkowski Safran & Cole, P.C.

(57) ABSTRACT

A content addressable memory (CAM) search engine is disclosed. The CAM search engine includes a data compare plane having a content addressable memory die including an array of comparison cells. The CAM search engine further includes a memory stack on the data compare plane. The memory stack has stacked memory dies including memory banks. The array of comparison cells includes parallel interconnects. The parallel interconnects electrically connect to outputs of the memory banks. The comparison cells are time-shared among the one or more memory banks.

20 Claims, 14 Drawing Sheets

(56) References Cited

OTHER PUBLICATIONS

Oh et al, "Technology Impact Analysis for 3D TCAM", IEEE 2009; 5 Pages.

Lin et al., "A Low Power Monolithically Stacked 3D-TCAM", IEEE 2008. pp. 3318-3321.

* cited by examiner

HIGH DENSITY SEARCH ENGINE

FIELD OF INVENTION

This invention relates generally to a content addressable memory (CAM) and, more particularly, to a stacked, three-dimensional (3D) device providing a high-capacity CAM search engine.

BACKGROUND

A CAM is a storage device in which data can be identified through a parallel search operation. A CAM typically includes an array of storage cells arranged in rows and columns, where each row of the CAM array corresponds to a stored word of reference data. The storage cells in a given row couple to a word line and a match line associated with the row. The word line is used to select the row for a read/write operation while the match line is used to signal a match or a miss during the search operation. Each column of the conventional CAM array corresponds to the same bit position in all of the words. The storage cells in a particular column are coupled to a pair of bit lines and a pair of search-lines associated with the column.

During a search operation, the match line develops a signal that indicates whether the word stored in the row matches a word of search data. The search data is applied to each pair of search lines, which have a pair of complementary binary signals or unique ternary signals thereon that represent a bit of an input value. Each CAM cell changes the voltage on the associated match line if the storage cell stores a bit that does not match the bit represented on the attached search lines. If the voltage on a match line remains unchanged during a search, the word stored in that row of storage cells matches the entire word of search data.

CAMs are much faster than conventional random access memory (RAM) for searching stored data because a search of all the words can be performed in parallel. However, use of CAMs is limited because of their large size, high cost, and large amounts of heat generated in comparison to conventional RAMs. For example, CAM cells are conventionally implemented using two static RAM (SRAM) cells and bit-compare circuitry (e.g., 16 transistors), which can require a large area ten times larger than conventional dynamic RAM (DRAM).

SUMMARY

In an aspect of the invention, a CAM search engine comprises a data compare plane having a content addressable memory die including an array of comparison cells. The CAM search engine further comprises a memory stack on the data compare plane. The memory stack has stacked memory dies including memory banks. The array of comparison cells comprises parallel interconnects. The parallel interconnects electrically connect to outputs of the memory banks. The comparison cells are time-shared among the one or more memory banks.

In further aspects of the invention, a method comprises providing a subset of reference data selected from reference data stored in a memory stack onto an array of parallel vertical interconnects of a data compare plane. The method also comprises applying search data to the subset of reference data on the vertical interconnects via search lines of the data compare plane. The method further comprises reading results of the applied the search data to the subset of reference data from match lines of the data compare plane. Additionally, the method comprises storing the results in a match analysis plane.

In further aspects, a stacked, three-dimensional CAM search engine comprises a memory stack comprising memory dies including a plurality of memory banks. The CAM search engine further comprises a data comparison die comprising search lines, match lines and an array of comparison cells. The comparison cells comprise an array of vertical interconnects electrically connected to respective outputs of the memory stack. The search lines connect the comparison cells in columns to an input register. The match lines connect the comparison cells in rows to outputs.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a CAM search engine, which comprises the structures of the present invention. In still further embodiments, a method in a computer-aided design system is provided for generating a functional design model of the CAM search engine. The method comprises generating a functional representation of the structural elements of the CAM search engine.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

This invention relates generally to a content addressable memory (CAM) and, more particularly, to a stacked, three-dimensional (3D) device providing high-capacity CAM search engine. The CAM search engine in accordance with aspects of the invention integrates a memory stack with a data comparison plane. In embodiments, parallel thru-silicon vias (TSVs) vertically connect outputs of the memory stack to an array of comparison cells of the data compare plane. The CAM search engine streams a serial stream of reference data from high-density memory in the memory stack to the compare plane. The comparison cells of the data compare plane are time-shared by the high-density memory in the memory stack, which provides for higher bandwidth and lower power consumption than a similar capacity conventional CAM.

For example, embodiments of the present invention connect DRAMs in the memory stack to the data compare plane using TSVs having, for example, a 2.5 μm pitch. The pitch of the TSVs reduces cell density of the CAM search engine by a factor of about 10 to 30 in comparison to a conventional CAM. However, the density of the DRAMs in the memory stack increases the storage capacity of the CAM search engine by a factor of more than 400; that is, when operated at twenty times lower speed (e.g., during data search operations), the CAM search engine in accordance with the present invention can occupy 400 times less space than the conventional CAM. Accordingly, the CAM search engine can occupy about 20-40 times less space than a conventional CAM of similar size while providing performance that is about equal.

Figure 1:
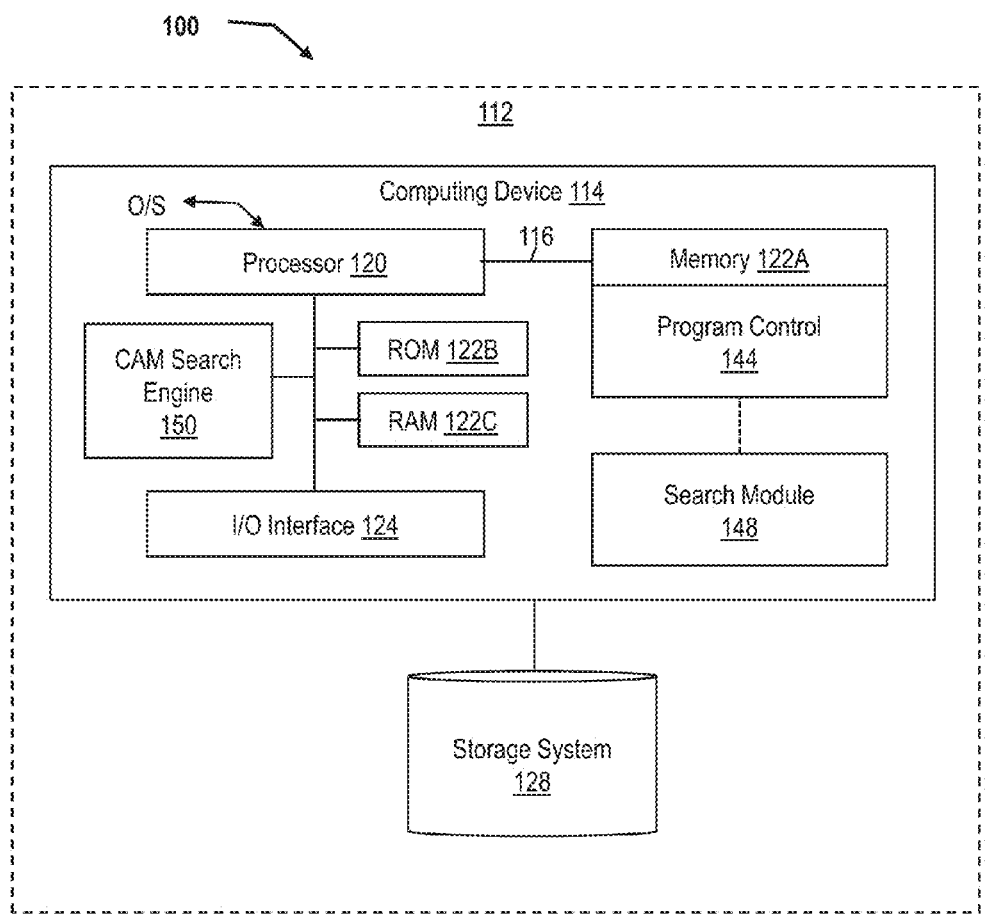
FIG. 1 shows an exemplary environment for implementing the steps in accordance with aspects of the invention.

FIG. 1 shows an exemplary environment 100 for implementing the steps in accordance with aspects of the invention. To this extent, the environment 100 includes a server or other computing infrastructure 112 that can perform the processes described herein. In particular, the computer infrastructure 112 includes a computing device 114. The computing device 114 can be resident on a network infrastructure or computing device of a third party service provider (any of which is generally represented in FIG. 1).

The computing device 114 also includes a processor 120, memory 122A, an I/O interface 124, and a bus 116. The memory 122A can include local memory employed during actual execution of program code, bulk storage, and cache memories which provide temporary storage of at least some program code in order to reduce the number of times code must be retrieved from bulk storage during execution. In addition, the computing device 114 includes a read-only memory (ROM) 122B, a random access memory (RAM) 122C (e.g., SRAM), and an operating system (O/S). The computing device 114 is in communication with a storage system 128. The bus 116 provides a communication link between each of the components in the computing device 114.

In general, the processor 120 executes computer program code (e.g., program control 144), which can be stored in the memory 122A and/or the storage system 128. Moreover, in accordance with aspects of the invention, program control 144 controls a search module 148 to perform one or more of the processes described herein using CAM search engine 150. The search module 148 can be implemented as one or more sets of program code in the program control 144 stored in memory 122A as separate or combined modules. Additionally, the search module 148 can be implemented as a state machine, as separate dedicated processors, or a single or several processors to provide the functionality described herein. In embodiments, the search module 148 can be integrated in the CAM search engine 150.

While executing the computer program code, the processor 120 can read and/or write data to/from memory 122A, 122B, and 122C, storage system 128, and CAM search engine 150. The program code executes the processes of the invention.

In embodiments of the invention, the search module 148 includes computer program code stored in, for example, memory 122A and/or 122B that, when executed by the processor 120, causes computing device 114 to perform a search that compares search data to reference data using the CAM search engine 150. In embodiments, the search module 148 receives search data from a software module (e.g., a user interface module, an address look-up module, or a pattern recognition module), and initiates a search of reference data stored in the CAM search engine 150. Additionally, in embodiments, the search module 148 controls the search performed by the CAM search engine 150. For example, the search module 148 may implement one or methods for serially providing reference data stored in a memory stack of the CAM search engine 150 to a data compare plane of the CAM search engine 150. Further, in embodiments, the search module 148 can change and/or update the reference data by writing information to the memory stack of the CAM search engine 150. Moreover, based on the results provided by the CAM engine 150, the search module 148 may determine search data and/or reference data for a subsequent search. For example, using the results of an initial search of the reference data, the search module 148 may perform a subsequent search to obtain narrower results.

The computing device 114 can comprise any general purpose computing article of manufacture capable of executing computer program code installed thereon (e.g., a personal computer, server, etc.). However, it is understood that the computing device 114 is only representative of various possible equivalent-computing devices that may perform the processes described herein. To this extent, in embodiments, the functionality provided by the computing device 114 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 112 is only illustrative of various types of computer infrastructures for implementing the invention. For example, in embodiments, the computing infrastructure 112 comprises two or more computing devices (e.g., a server cluster) that communicate over any type of communications link, such as a network, a shared memory, or the like, to perform the process described herein. Further, while performing the processes described herein, one or more computing devices on the computing infrastructure 112 can communicate with one or more other computing devices external to the computing infrastructure 112 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
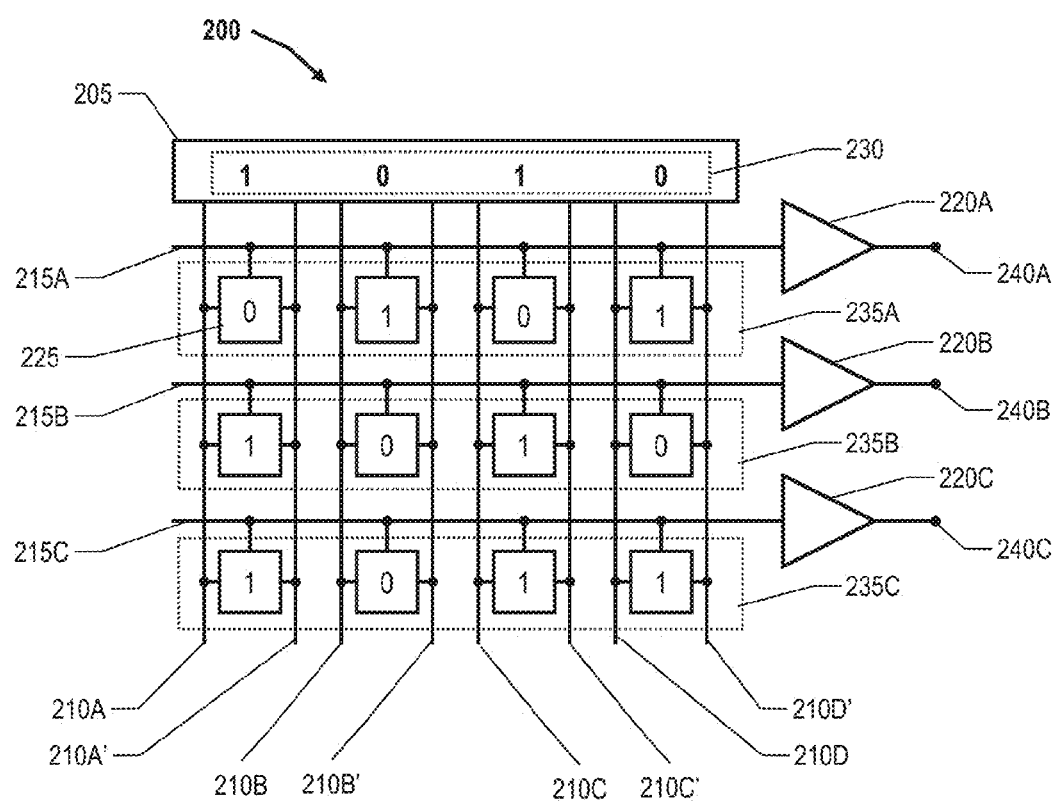
FIG. 2 illustrates an exemplary binary CAM.

FIG. 2 illustrates an exemplary binary CAM ("BCAM") 200. The BCAM 200 includes an input register 205, search line pairs 210A/210A' . . . 210D/210D', match lines 215A . . . 215C, sense amplifiers 220A . . . 220C, and an array of storage cells 225. The storage cells 225 have two states: a high state (i.e., "1") and a low state (i.e., "0"). The high state and the low state may represent a high digital logic voltage (e.g., 1.0V) and a low digital logic voltage (e.g., 0.0V), respectively. The input register 205 stores a row of search data 230, which is a word comprised of bits to be searched in the array of storage cells 225. Each bit of the input register 205 corresponds to a respective column of the search line pairs 210A/210A' . . . 210D/210D'.

The search line pairs 210A/210A' . . . 210D/210D' connect individual bits of data stored in the input register with respective columns in the array of storage cells 225. The first bit (i.e., the most significant bit) of the input register 205 is connected to a column of the array of storage cells 225 along the search line pair 210A/210A', the second bit of the input register 205 is connected to a column of the array of storage cells 225 along the search line pair 210B/210B', the third bit of the input register 205 is connected to a column of the array of storage cells 225 along the search line pair 210C/210D', and the fourth bit (i.e., the least significant bit) of the input register 205 is connected to a column of the array of storage cells 225 along the search line pair 210D/210D'. The match lines 215A . . . 215C connect rows of the array storage cells 225 to respective ones of output sense amplifiers 220A . . . 220C. Match line 215A connects row 235A to sense amplifier 220A, match line 215B connects row 235B to sense amplifier 220B, and match line 215C connects row 235C to sense amplifier 220C. The storage cells 225 in each row 220A . . . 220C contain reference data, which are words comprised of digital bits. A processor (e.g., processor 120 executing search module 148) can store the reference data in the storage cells 225 using conventional techniques for storing information in a computer memory or storage device. For example, the words of reference data may addresses information corresponding to a database.

The BCAM 200 performs a search of the reference data by applying the search data in the input register 205 to reference data stored in the array of storage cells 225 of the BCAM 200 along each of the search line pairs 210A/210A' . . . 210D/210D'. In parallel, search results develop a voltage on the match lines 215A . . . 215C. A digital voltage (e.g., 0.0 V or 1.0 V) on each of the match lines 215A . . . 215C indicates whether value of the corresponding word of the reference data misses or matches with the search data. The output sense amplifiers 220A . . . 220C detect the voltages developed on the match lines 215 and generate signals at outputs 240A . . . 240C having digital voltage indicting the miss or the match between the search data 230 and the respective reference data in rows 215A . . . 215C.

For example, the search data 230 in the input register of the BCAM 200 in FIG. 2 can have the value 1-0-1-0. The array of storage cells 225 in rows 215A . . . 215C of the BCAM 200 store three words of reference data, including 0-1-0-1, 1-0-1-0, and 1-0-1-1. Each bit of the search data 230 is compared to the respective bits of the reference data in rows 215A . . . 215C along the search line pairs 210A/210A' . . . 210D/210D. If there are any mismatches between a particular bit of the search data 230 and a corresponding bit of the reference data, then the respective one of match lines 215A . . . 215C develops a first predetermined voltage (e.g., 0.0V). In this example, if reference data stored in the fourth storage cell 225 of rows 215C does not match a corresponding bit of search data in the input register 205 along match line pair 210D/210D', the match line 215C develops the first predetermined voltage, which is detected by the output sense amplifier 220C to generate an output logic signal 240C indicating a mismatch. On the other hand, if all the bits of the search data match the corresponding bits of the reference data, then the respective ones of match lines 215A . . . 215C develops a second predetermined voltage (e.g., 1.0V). For instance, if the reference data stored in each of the storage cell 225 of row 215B matches the corresponding bits of search data in the input register 205 along match line pairs 210A/210A' . . . 210D/210D'; the match line 215B develops the second predetermined voltage. This second predetermined voltage is detected by the output sense amplifier 220B to generate output logic signal 240B indicating a match.

As described above, the BCAM 200 performs a parallel search of all the reference data in a single clock cycle. Thus, the BCAM 200 provides a fastest known way to implement compare search data within, for example, a look-up table. Notably, the BCAM 200 shown in FIG. 2 includes four columns and three rows for the sake of illustration. However, the BCAM 200 can include a greater amount of columns and rows.

Figure 3:
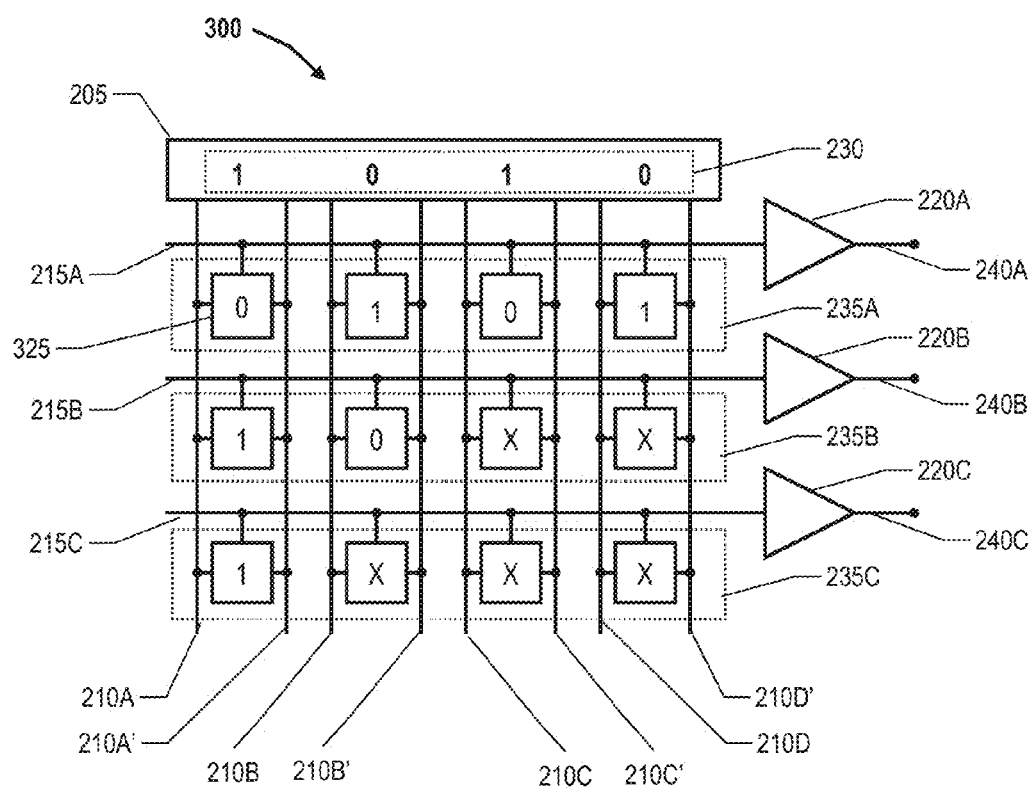
FIG. 3 illustrates an exemplary ternary CAM.

FIG. 3 illustrates an exemplary ternary CAM (TCAM) 300. The TCAM 300 includes input register 205, search line pairs 210A/210A' . . . 210D/210D', match lines 215A . . . 215D, output sense amplifiers 220A . . . 220C, and outputs 240A . . . 240C, which may the same as those already described herein. Additionally, the TCAM 300 includes an array of storage cells 325 that each can have three states, including a high state (i.e., "1"), a low state (i.e., "0"), and a wildcard state (i.e., "X"). The high state and the low state may represent a high digital logic voltage (e.g., 1.0V) and a low digital logic voltage (e.g., 0.0V), respectively. The wildcard value "X" is neither a 0 nor a 1. More specifically, a TCAM can encode data using two storage cells per bit of data. In embodiments, the low state of the bit is stored in the two cells as 0/1, the high state is stored in the two cells as 1/0, and the wildcard stated can be stored in the two cells 0/0. Wildcards are used, for example, in routing tables to allow longest prefix matching for network addresses. A value stored in a particular storage cell 325 that is an X is considered to match a corresponding bit of the search data 230 regardless of whether has the high state or the low state. For example, the exemplary TCAM 300 in FIG. 3 includes three words in the storage cells 325, including a first word 235A (0-1-0-1), a second word 235B (1-0-X-X), and a third word 235C (1-X-X-X). As is evident in FIG. 3, the value of the second word 235B (1-0-X-X) matches the value of the search data 230 of the input register 205 (1-0-1-0) because the first two bits are the same and the last two bits of the second word are wildcards. Similarly, the third word 235C (1-X-X-X) matches the value of the search data 230 of the input register 205 (1-0-1-0) because the first bits are the same and the last three bits of the second word are wildcards.

Figure 4:
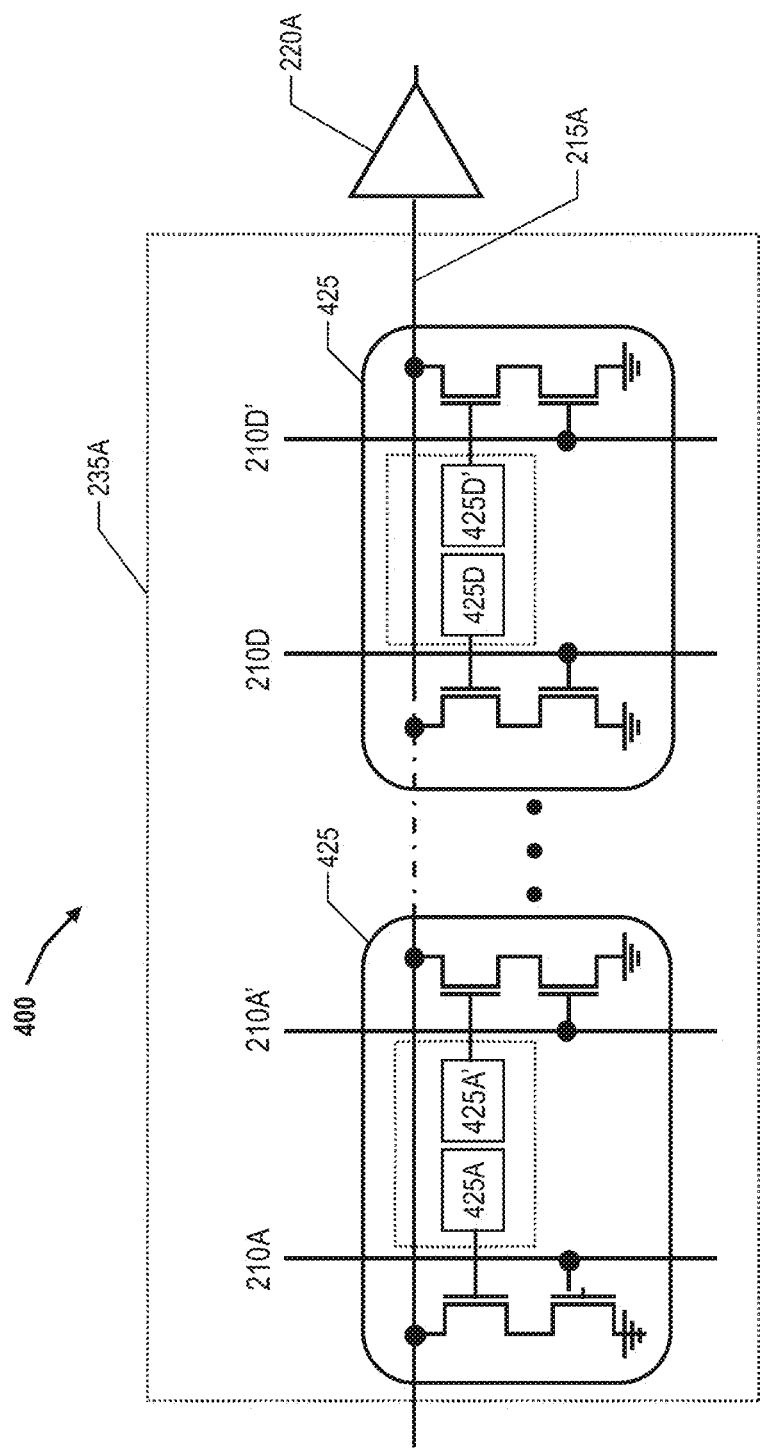
FIG. 4 illustrates an embodiment of an exemplary ternary CAM.

FIG. 4 illustrates a single row 235A in an embodiment of an exemplary TCAM 400. The ternary CAM 400 includes search line pairs 210A/210A' . . . 210D/201D', match line 215A, and output sense amplifier 220A, which can be the same as those already described herein. Additionally, row 235A includes an array of storage cells 425, which can be the same as the storage cells shown FIGS. 2 and 3. Each of the storage cells 425 include respective pairs of sub-cells 425A/425A' . . . 425D/425D' that each store two values representing the data stored in the storage cells 425. The sub-cells 425A/425A' . . . 425D/425D' in each storage cell 425 can be, for example, SRAM cells. The pairs of sub-cells 425A/425A' . . . 425D/425D' take on the same or different logic states (i.e., high or low). For example, if the values 425A and 425A' are "0" and "1", then the logic state is low. On the other hand, if the values 425A and 425A' are "1" and "0", then the logic state is high. And, if the values 425A and 425A' are "0"

and "0" then the logic state is Wildcard (i.e., "X"). The fourth state when the values 425A and 425A' are "1" and "1" is the always-miss state and is not typically used in a TCAM.

To perform a search operation, the TCAM 400 initially resets the search lines 210A/210A' . . . 210D/210D' to ground voltage (e.g., 0.0V). The match line 215A is precharged to a nominal voltage (e.g., 1.0V). Then, the TCAM 400 applies search data (e.g., search data 230) to each of the search lines 210A/210A' . . . 210D/210D' (e.g., via the input register 205). Any mismatches between the search data on the search lines 210A/210A' . . . 210D/210D' and the respective values stored in the storage cells 425A . . . 425D are detected on the match line 215A as logic voltage and outputted by the sense amplifier 220A. For example, a mismatch between a bit of search data (e.g., search data 230) applied to the pair of search lines 210A/210A' can change the value to the match line 215A from the nominal voltage to a ground voltage (e.g., from 1.0V to 0.0V). The resulting voltage of the match line 215A causes the sense amplifier 220A to output a digital logic signal (e.g., 0.0V), which indicates mismatch. On the other hand, if all of the search data on search lines 210A/210A' . . . 210D/210D' match the respective bits of the reference data (i.e., the reference data has the same value as the search data or a wildcard value), then the resulting voltage of the match line 215A will remain at the nominal voltage (e.g., about 1.0V). This causes the sense amplifier 220A to output a high digital logic voltage (e.g., about 1.0V), which indicates a match. While FIG. 4 shows only a single row 235A of the array of storage cells 425, the array can have any size. The TCAM 400 can compare search data with reference data of the entire search array of storage cells 425 in one memory cycle.

Figure 5:
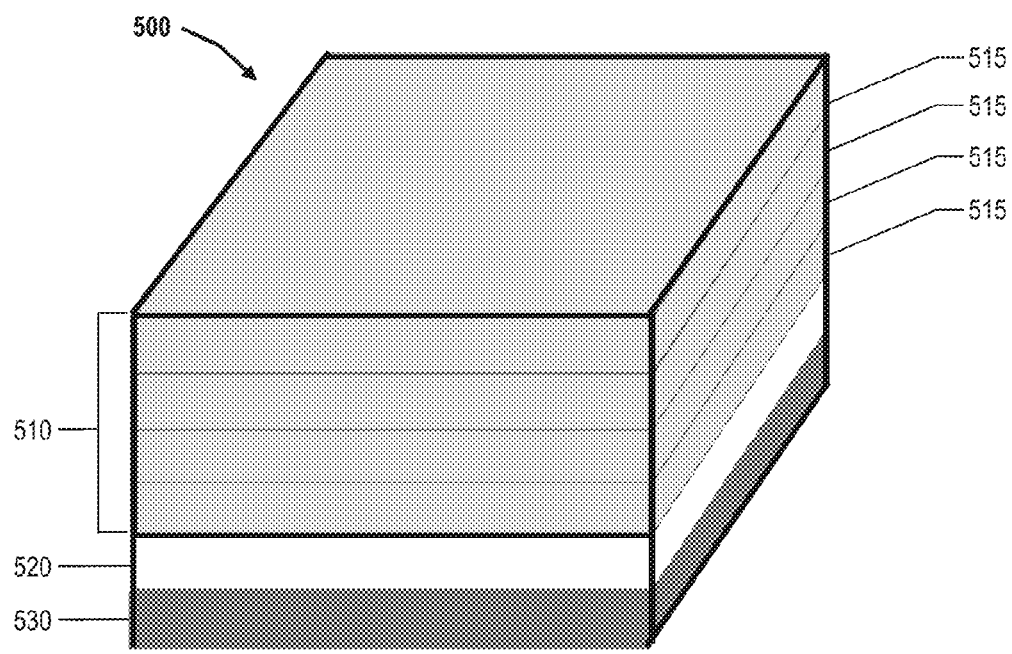
FIG. 5 illustrates an exemplary high-density CAM search engine in accordance with aspects of the present invention.

FIG. 5 illustrates an exemplary high-density CAM search engine 500 in accordance with aspects of the present invention. In embodiments, the CAM search engine 500 is a stacked, 3D device including a memory stack 510, a data formatting plane 520, and a data compare plane 530. The CAM search engine 500 provides a serial stream of reference data from the memory stack 510 into the data compare plane 530 for comparison with search data (e.g., search data 230). Memory banks in the memory stack time-share comparison cells in the comparison plane, which results in high-density, high-bandwidth, and power-efficient search engine.

In accordance with aspects of the invention, the memory stack 510 is a stacked, 3D memory array comprising memory dies 515, each of which includes one or more memory banks. In embodiments, the memory stack 510 is a stack of DRAM banks. For example, the memory stack 510 can be formed using several substantially identical memory dies 515 including one or more DRAM banks, which provide high-density storage of reference data (e.g., greater than 64 gigabytes) in the CAM search engine 500.

In accordance with aspects of the present invention, the data formatting plane 520 is a die in the CAM search engine 500 that interfaces the memory stack 510 with the data compare plane 530. The data formatting plane 520 aggregates reference data provided from the memory stack 510 and remaps the reference data into a format for the data compare plane 530. The data formatting plane 520 includes parallel interconnects that make electrical connections between the outputs of memory banks in the memory stack 510 and the comparison cells in the data compare plane 530. In embodiments, the parallel interconnects include TSVs through the data compare plane 520. The parallel interconnects of the data formatting plane 520 can route the reference data to comparison cells in the data compare plane 530 using an array of parallel vertical TSVs that vertically align with the comparison cells. Accordingly, by implementing aspects of the invention the parallel interconnects of the data formatting plane 520 physically route outputs of the memory stack 510 that are not in direct alignment with corresponding comparison cells in the data compare plane 530. For example, the memory stack 510 can connect to the data formatting plane 510 at the locations corresponding to the output pins of DRAM banks of the memory stack 510.

In accordance with aspects of the invention, the data compare plane 530 is one or more dies in the CAM search engine 500 that determines whether reference data matches a given set of search data. The data compare plane 530 can have a structure similar to the CAMs described previously (e.g., BCAM 200, TCAM 300, and TCAM 400). However, the data compare plane 530 is not limited to the CAM structures shown in FIGS. 2-4, and other types of TCAM structures can be used in embodiments of the invention. For example, the data compare plane 530 can be structured as a hybrid NOR/NAND TCAM, an algorithmic TCAM, a binary tree, a hashing, or other such conventional CAM structures.

In accordance with aspects of the invention, the CAM search engine 500 uses logic (e.g., search module 148) and data storage (e.g., memory 122A) that controls the streaming of reference data from the memory stack 510 to the data compare plane 530. The logic and data storage can be incorporated in any one of the memory stack 510, the data formatting plane 520, and the data compare plane 530, or distributed amongst them. High-density macros (e.g., search module 148) control the CAM search engine 500 to stream reference data in a predictable manner from the memory stack 510, though the data formatting plane 520, to the data compare plane 530 by cycling though each word of reference data. For example, control logic in the data formatting plane may maintain a data buffer that queues a selected subset of the reference data provided by the memory stack. The data buffer can output the subset of reference data in parallel to the array of parallel load vertical interconnects of the data compare plane 520 via the wiring and/or TSVs of the data formatting plane 520.

Additionally, in embodiments of the invention, bandwidth is increased using DRAM data bursting (e.g., cycling though DRAM decodes), wherein each memory bank provides data in parallel, rather than using global data lines to their peripheries. The data compare plane 530 compares search data to the burst serial data provided by the memory stack 510. Further, in embodiments, refresh controllers for memory banks (e.g., DRAM refresh controllers) can be simplified because of the predictable access pattern (e.g., vertical or horizontal sequential retrieval of reference data). Moreover, in embodiments, the CAM search engine can be an algorithmic CAM to improve area at the cost of performance in particular applications.

Further, FIG. 5 shows the memory stack 510 connected to the data compare plane 530 though the data formatting plane 520. In embodiments of the invention, the data compare 530 can be directly connected to the memory stack 510 without the data formatting plane 520. For example, the memory stack 510 can includes a shift register that supplies information from the memory stack data 510 to comparators on the data compare plane 530.

Figure 6:
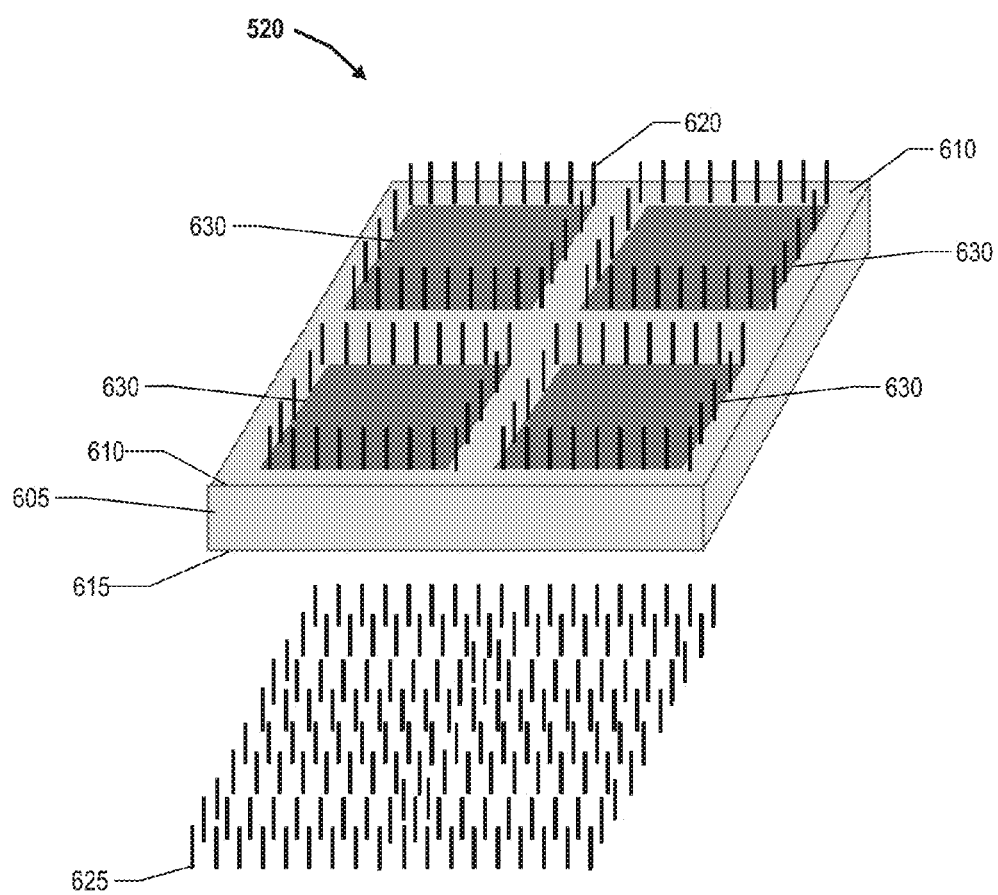
FIG. 6 shows an exemplary data formatting plane in accordance with aspects of the present invention.

FIG. 6 shows an exemplary data formatting plane 520 in accordance with aspects of the present invention. The data formatting plane 520 is one or more dies that provide a physical and logical interface between the memory stack 510 and the data compare plane 530. For example, the data formatting plane 520 implements TSV image reformatting and data organization in the CAM search engine 500 to interface the memory stack 510 with the data compare plane 530. In accordance with aspects of the invention, the data formatting plane 520 physically integrates the memory stack 510 with the data compare plane 530.

In embodiments, the data formatting plane 520 includes a die 605 having an upper surface 610 and lower surface 615. The upper surface 610 includes upper connectors 620 and the lower surface includes lower connectors 625. For clarity, FIG. 6 shows a partially exploded view in which lower connectors 625 are illustrated apart from the data formatting plane 520. However, the exploded view is merely provided to better show the arrangement of the lower connectors 625. The lower connectors 625 are located on the lower surface 625 of die 615 and can be in direct electrical connection with the corresponding ones of the upper pins 610. As such, in embodiments of the invention, the lower connectors 625 are arranged in an array, having locations corresponding to an array of parallel vertical interconnects (e.g., TSVs) in the data compare plane 530. By comparison, the upper connectors 620 are arranged to correspond to output connections of the memory stack 510.

According to aspects of the invention, the upper surface 610 of the data formatting plane 520 interfaces with the memory stack 510. The upper surface 610 includes the upper connectors 620 and memory shadow areas 630. The upper connectors 620 can be metal contacts (e.g., connector pins and/or TSVs). The memory shadow areas 630 are regions beneath (i.e., in the shadow of) memory banks of the memory stack 510. This is because input/output connections (e.g., pins) of the memory banks (e.g., DRAMs) are typically located around the periphery of the memory banks, and not directly below the bodies of the memory banks. Thus, in accordance with aspects of the invention, the data formatting plane 520 has upper connections (e.g., input pins) 620 at locations corresponding to the input/output connections of the memory banks, and lacks pins at locations directly beneath the bodies of the memory banks (i.e., the memory shadow regions 630). In embodiments, the memory shadow regions 630 are areas on the upper surface 610 of the data formatting plane 520 that lack any input/output signal connections to the memory stack 510. The lower surface 615 interfaces with the data compare plane 530 via the lower connectors 625. In embodiments, the lower connectors 625 are distributed as an array pattern that corresponds to locations of comparison cells arrayed in the data compare plane 530. The lower connectors may be distributed uniformly with respect to the data compare plane 530.

Figure 7:
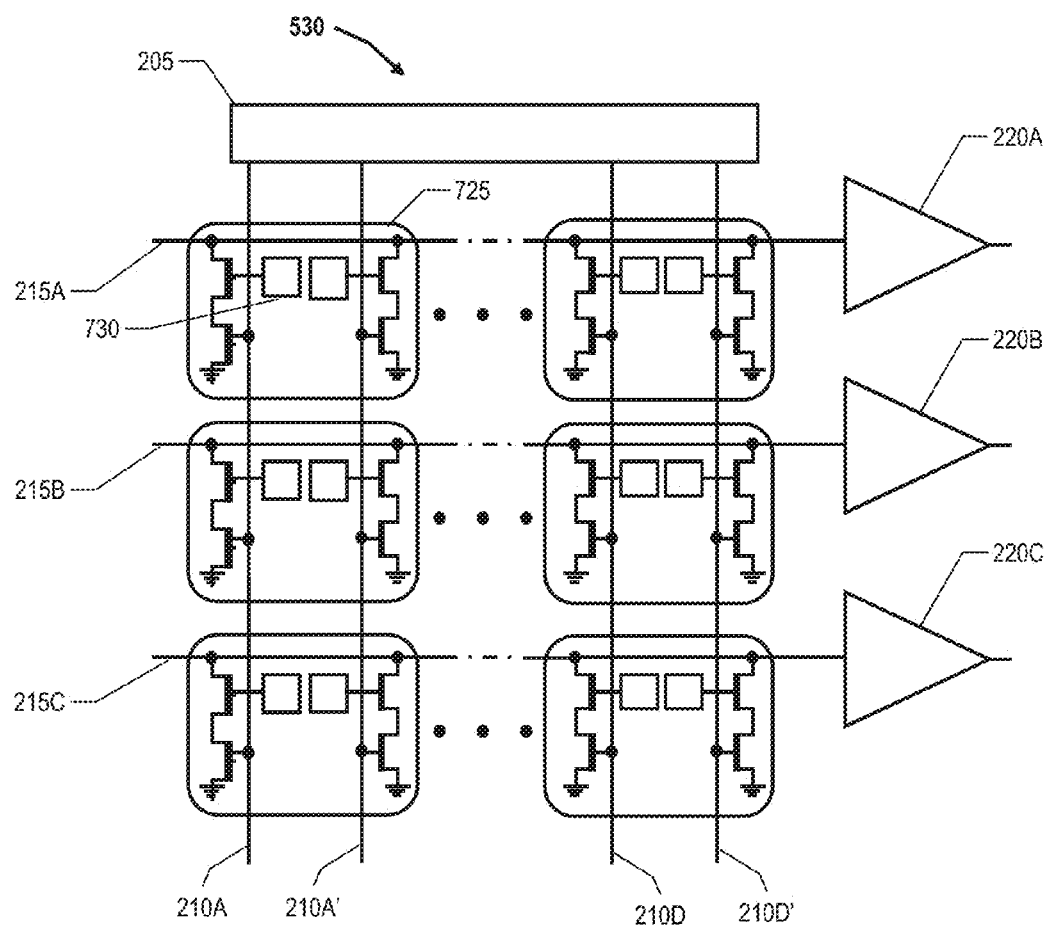
FIG. 7 shows an exemplary data compare plane in accordance with aspects of the invention.

FIG. 7 shows an exemplary data compare plane 530 in accordance with aspects of the invention. In embodiments, the data compare plane 530 includes input register 205, search line pairs 210A/210A' . . . 210D/210D', match lines 215A . . . 215C, and sense amplifiers 220A . . . 220C, which may be arranged and function the same as those already described herein. Additionally, in accordance with aspects of the invention, the data compare plane 530 includes an array of data comparison cells 725 that are electrically connected to storage cells in the memory stack 510 via the data formatting plane 520, by respective pairs of parallel vertical interconnects 730. The vertical interconnects 730 can be, for example, TSVs.

In operation according to aspects of the invention, search data (e.g., search data 230) input to the input register (e.g., by processor 120) is applied to the search lines 210A/210A' . . . 210D/210D'. Reference data stored in the memory stack 510 is iteratively read and applied to the data comparison cells 725 through respective ones of the vertical interconnects 730. For each iteration of reference data applied to the search lines 210A/210A' . . . 210D/210D', the match lines 215A . . . 215C indicate whether the reference data matches the search data in a similar manner to that described above with regard to FIGS. 2-4. The sense amplifiers 220A . . . 220C receive the result of matching from the match lines 215A . . . 215C and output a corresponding digital logic voltage.

In embodiments, the sets of reference data are serially provided from the memory stack 510 to the data compare plane 530. For example, each subset of reference data retrieved from a memory stack (e.g., memory stack 510) can be applied to the vertical interconnects 730 of the comparison cells 725. As such, a number of iterations are used to compare an entire set of reference data in the memory stack to the search data. Due to the high data capacity, the CAM search engine 500 can provide the same or better parallel performance as a conventional CAM using 20 to 40 times less space.

Figure 8A:
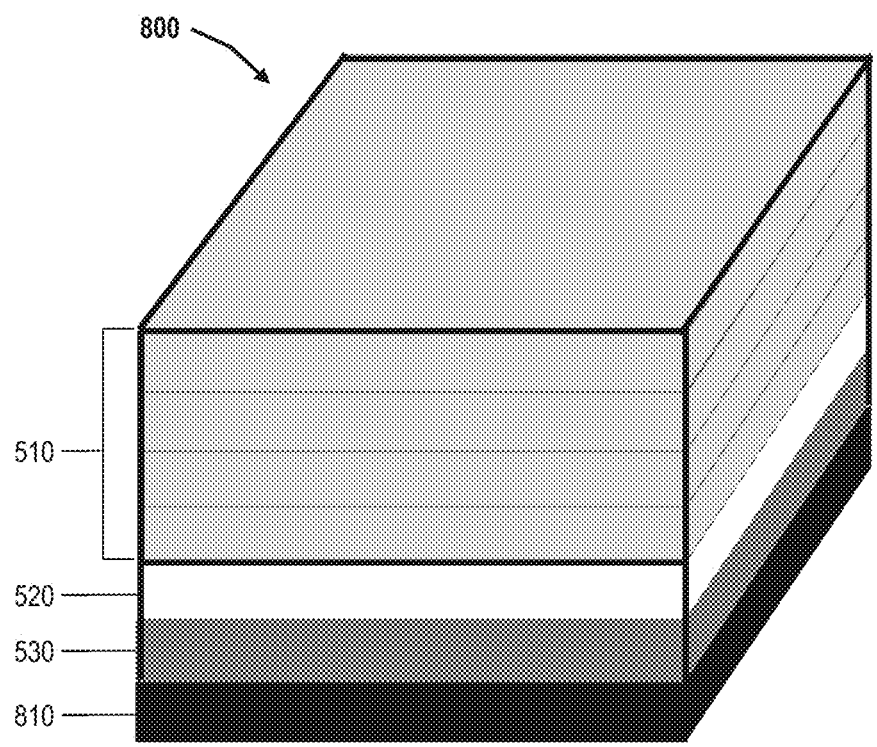
FIG. 8A illustrates a CAM search engine in accordance with aspects of the present invention.

FIG. 8A illustrates a CAM search engine 800 in accordance with additional aspects of the present invention. The CAM search engine 800 includes memory stack 510, data formatting plane 520, and data compare plane 530 that may the same as those already described herein. Additionally, in accordance with aspects of the invention, the CAM search engine 800 includes a match analysis plane 810. In embodiments, the match analysis plane 810 includes one or more data storage hardware devices that stores previous data that has returned a match and, additionally, stores pertinent record information (e.g., identifying information, source addresses, and count of matches). Results from multiple different searches executed on the data from the partial or full memory stack can be kept in the match analysis plane 810 for further analysis. Thus, results of this search of the memory stack 510 can be communicated to a system (e.g., computer infrastructure 112). Additionally, the match analysis plane 810 can perform a secondary search of the search results (e.g., a combined-search). More specifically, in embodiments, the search results are stored in the memory stack 510 and can be used to select a subset of reference data for a subsequent search.

Figure 8B:
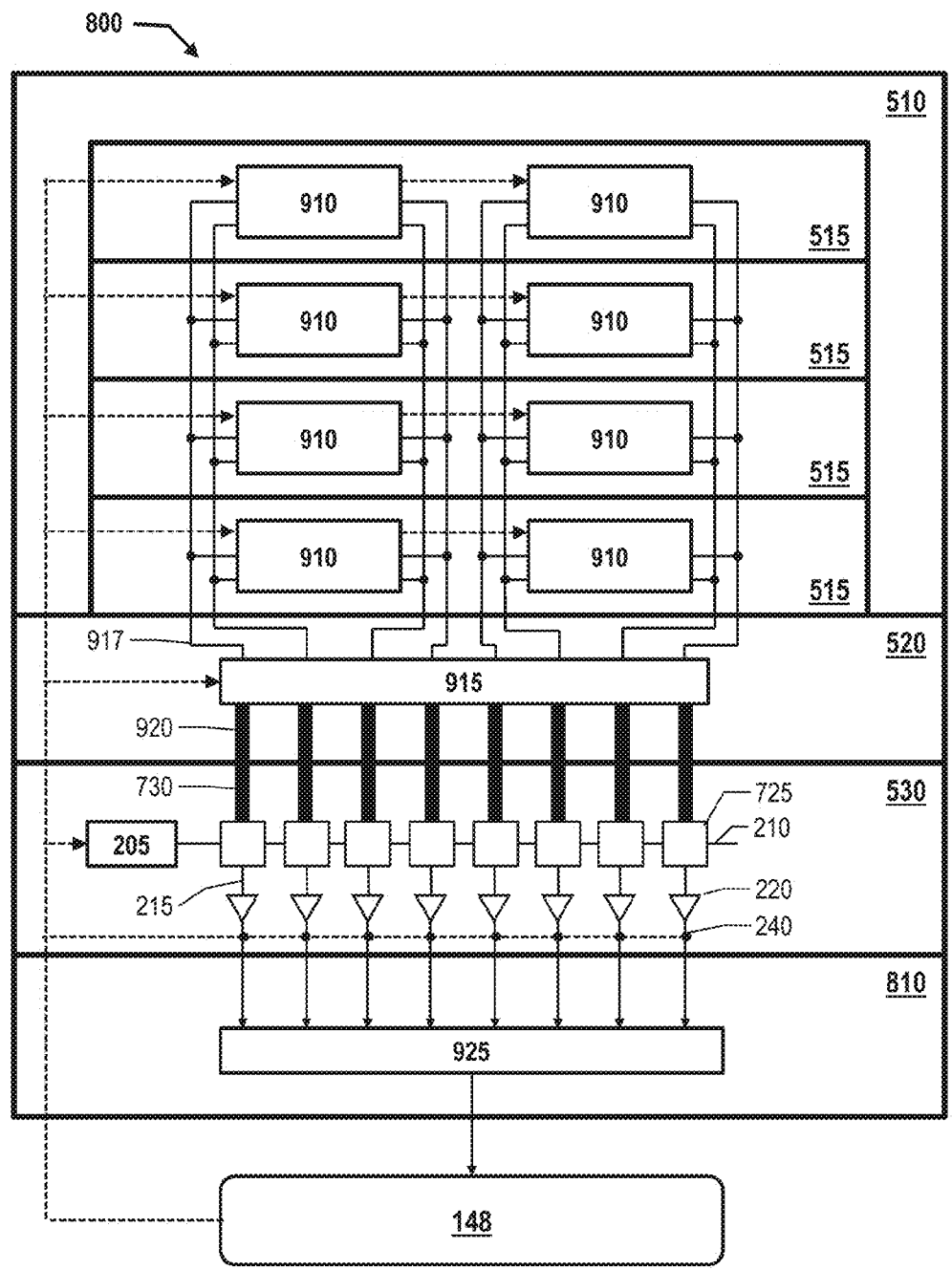
FIG. 8B illustrates a functional block diagram of an exemplary CAM search engine in accordance with aspects of the present invention.

FIG. 8B illustrates a functional block diagram of exemplary CAM search engine 800 in accordance with aspects of the present invention. The CAM search engine 800 is a stacked, 3D device including, search module 148, memory stack 510, data formatting plane 520, data compare plane 530, and match analysis plane 810, which may be the same as those already described herein. In accordance with aspects of the invention, the search module 148 controls processes of the CAM search engine 150. Additionally, in embodiments, the search module 148 controls power and redundancy of the memory stack 510 and data compare plane 530. The search module 148 can be external to the CAM search engine 800 or it can be incorporated (partially or entirely) within to the CAM search engine 800. In embodiments, the search module 148 is one or more sets of program code stored in memory (e.g., memory 122A) and executed by a processor (e.g., processor 120) of a computer device (e.g., computing device 114) that includes the CAM search engine 800 (which may be the represented as CAM search engine 150). In other embodiments, the search module 148 is implemented as a state machine or as separate dedicated processors, incorporated in the CAM search engine 800.

In accordance with aspects of the invention, the memory stack 510 includes the memory dies 515. Each of the memory dies 515 includes one or more memory banks 910, which form a stacked, 3D memory device. The memory banks 910 can be, for example, DRAM cores. The inputs and outputs of the memory stack 510 can be through the bottommost one of the memory dies 515, which is stacked on the data formatting plane 520.

In accordance with aspects of the present invention, the data formatting plane 520 aggregates and routes information reference data provided from the memory stack 510 to the data compare plane 530. In embodiments, the data formatting plane 520 includes a data buffer 915 and parallel vertical die interconnects 920. In embodiments, the parallel die interconnects 920 are TSVs through the die of the data compare plane 520. The data buffer 915 queues a selected subset of the reference data from the memory stack 510 before providing the subset of reference data to the data comparison plane 530. For example, the search module 148 can select the subset of the reference data in one or more of the memory banks 910 for comparison with search data. The selected subset of reference data is queued in the data buffer 915 and then provided to the data comparison plane 530. In this manner, the comparison cells of the data compare plane 530 are time-shared among the memory banks 910. Notably, while the data buffer 915 is shown in FIG. 8B in the data formatting plane, the data buffer 915 and/or its functionality can, instead, be incorporated in the memory stack 510 or the data compare plane 530.

Additionally, in accordance with aspects of the present invention, the data formatting plane 520 includes wiring 917 that provide electrical connections between the outputs of memory banks 910 in the memory stack 510 and the comparison cells 725 in the data compare plane 530. In accordance with aspects of the invention, the wiring 917 and the parallel die interconnects 920 physically route outputs of the memory stack 510 that are not in direct alignment with corresponding comparison cells 725 in the data compare plane 530. For example, the memory stack 510 may connect to the data formatting plane 510 at the locations corresponding to output pins of DRAM banks of the memory stack 510. The data formatting plane 520 routes the reference data to the comparison cells 725 in the data compare plane 530 using the array parallel die interconnects 920 that are vertically aligned with the comparison cells 725 in the CAM search engine 800.

In accordance with aspects of the invention, the data compare plane 530 includes input register 205, search lines 210, match lines 215, sense amplifiers 220, outputs 240, comparison cells 725, and parallel vertical interconnects 730, which may be the same as those already described herein. In embodiments, the search module 148 loads a word of search data into the input register 205 and controls the data buffer 915 to provide the subset of reference data provided from the memory stack 510 to the comparison cells 725 via the parallel vertical interconnects 730. The search module 148 controls the input register 205 to apply the word of search data to the subset of reference data via the search lines 210. Then the search module 148 reads and/or stores results provided from the match lines 215 to the sense amplifiers 220 via the outputs 240.

In accordance with aspects of the invention, the match analysis 810 plane includes a hardware data storage device 925. In embodiments, the search module 148 stores the results provided by the data compare plane in the data storage device 925 for further reference and/or analysis. In addition, the search module 148 can store metadata in association with the results that describes subset of reference data (e.g., identification information, address information, and count information). Additionally, in accordance with aspects of the present invention, the stored search results generated from one or more subsets of reference data can be used as reference data in subsequent comparison iterations executed by the CAM search engine 800 to produce a narrower result. In embodiments, the search module 148 feeds back search results stored on the match analysis plane 810 to the memory stack 510 for use reference data that is compared to another word of search data by the CAM search engine 800.

Figure 9:
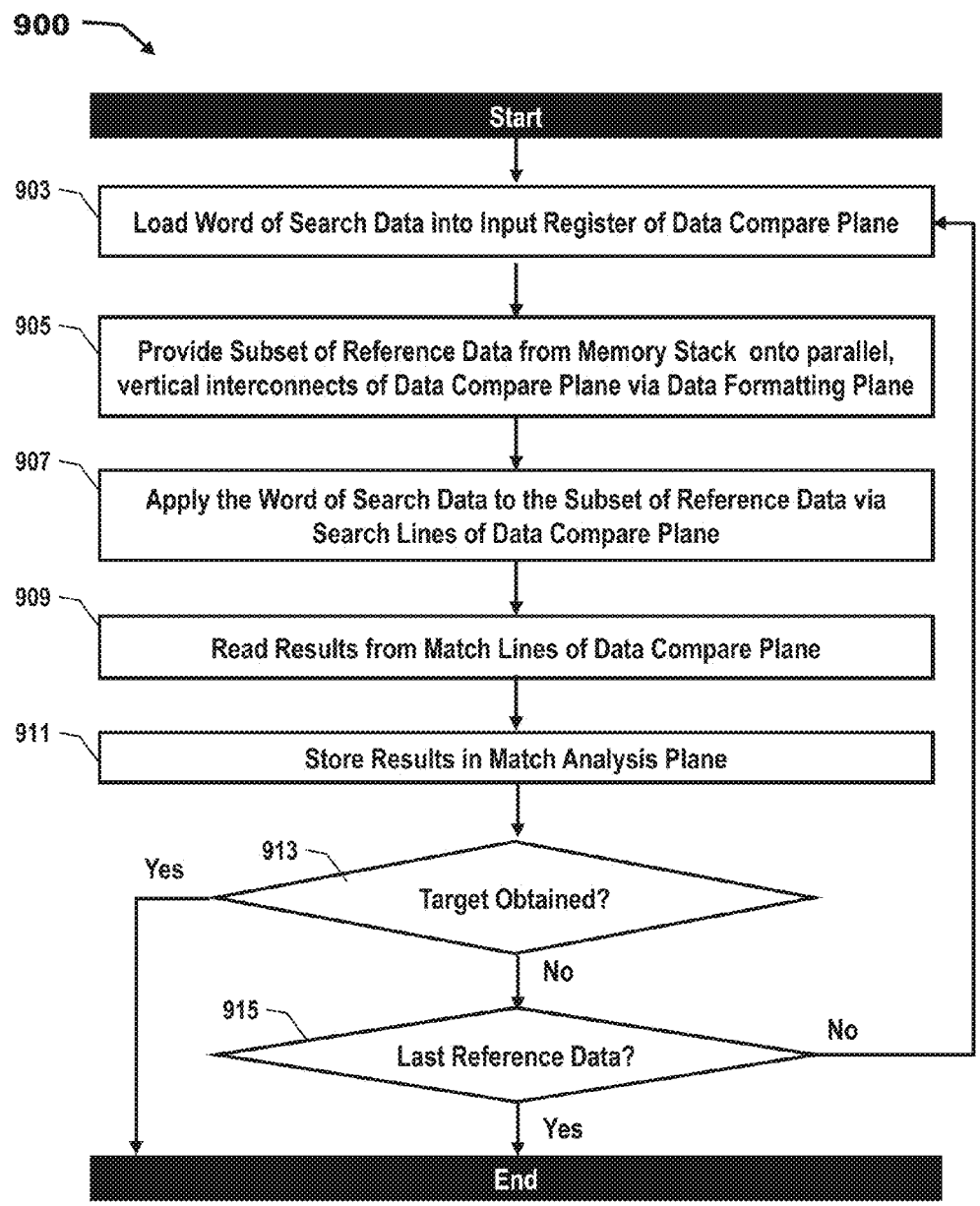
FIG. 9 shows an exemplary process flow for performing aspects of the present invention.

The flowchart in the FIG. 9 illustrates the architecture, functionality, and operation of possible implementations of systems, methods, and computer program products according to various embodiments of the present invention. For example, FIG. 9 can illustrate an implementation of program control (e.g. program control 144) and/or search module (e.g., search module 148) in a computing device (e.g., computing device 114). In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 9 shows an exemplary process flows for performing aspects of the present invention. The steps of FIG. 9 can be implemented in the circuits of FIGS. 5-8B. The flowchart in FIG. 9 illustrates the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 9 depicts an exemplary flow of a process 900 for searching a CAM search engine (e.g., CAM search engine 500 or CAM search engine 800) in accordance with aspects of the invention. In embodiments, a logic module (e.g., search module 148) controls the CAM engine to serially stream words of reference data from a memory stack (e.g., memory stack 510) and provided to a data compare plane (e.g., data compare plane 530) via a data formatting plane (e.g., data formatting plane 520). Also, in embodiments, the reference can be provided using burst mode communication, which increases the data transfer rate between individual memory banks in the memory stack 510 and the data comparison plane 530.

At step 903, the logic module stores a search (e.g., search word 230) into an input register (e.g., input register 205). At step 905, the logic module reads a selected subset of the reference data stored in the memory stack onto parallel vertical interconnects (e.g., vertical interconnects 730) in comparison cells (e.g., comparison cells 725) of the data compare plane via the data formatting plane. In embodiments, the subset reference data is retrieved from a number of predefined addresses of the memory stack. For example, the memory stack may include a number of DRAMs that each have a range of predetermined, consecutive memory addresses that contain the reference data. The logic module can maintain data registers that store pointers to current memory addresses being processed by the CAM search engine. Accordingly, the CAM search engine can read the reference data stored at the current memory addresses of the memory stack in one or more memory banks (e.g., memory banks 910). In accordance with aspects of the invention, the outputs of the memory stack are connected to corresponding vertical interconnects in an array of data compare cells (e.g., data compare cells 725) of the data compare plane by parallel vertical interconnects (e.g., TSVs) included in the data formatting plane, which compares the search data in the input register.

At step 907, the logic module applies the word of search data from step 903 to the subset of reference data provided at step 905 via search lines (e.g., search lines 210A/210A' . . . 210D/210D'). At step 909, the CAM search engine reads the results of comparisons between the search data and the current reference data from match lines (e.g., match lines 215A . . . 215C) of the data compare plane. For example, a sense amplifier (e.g., sense amplifier 220A) at the output of the match line in the data compare plane can output a digital logic voltage indicating whether the search data matches the reference data at the TSVs along the corresponding match line. Thus, if the search data matches the reference data (exactly or based on wildcards), then the sense amplifier outputs a first digital logic value. If the search data does not match the reference data, then the sense amplifier outputs a second digital logic value.

At step 911, the logic module stores the results read at step 909 in the match analysis plane. In embodiments, the digital logic voltage output of each sense amplifiers in the data compare plane is stored as word of data in the storage cells of the match analysis plane.

At step 913, the logic module determines whether a predefined target is obtained. For example, the target may be to identify a predetermined number of matches (e.g., 1) between the search data and the reference data in a portion of the memory stack 510 or in the entire the memory stack 510. If the target is obtained, then the process ends. Otherwise, at step 915, the logic module determines whether the reference data is the last reference data. In embodiments, the logic module determines whether current memory address is the last memory address in the range of memory addresses of the memory stack. If not, the logic module increments the value of the current memory address and iteratively returns to step 903. If so, the process ends.

Figure 10:
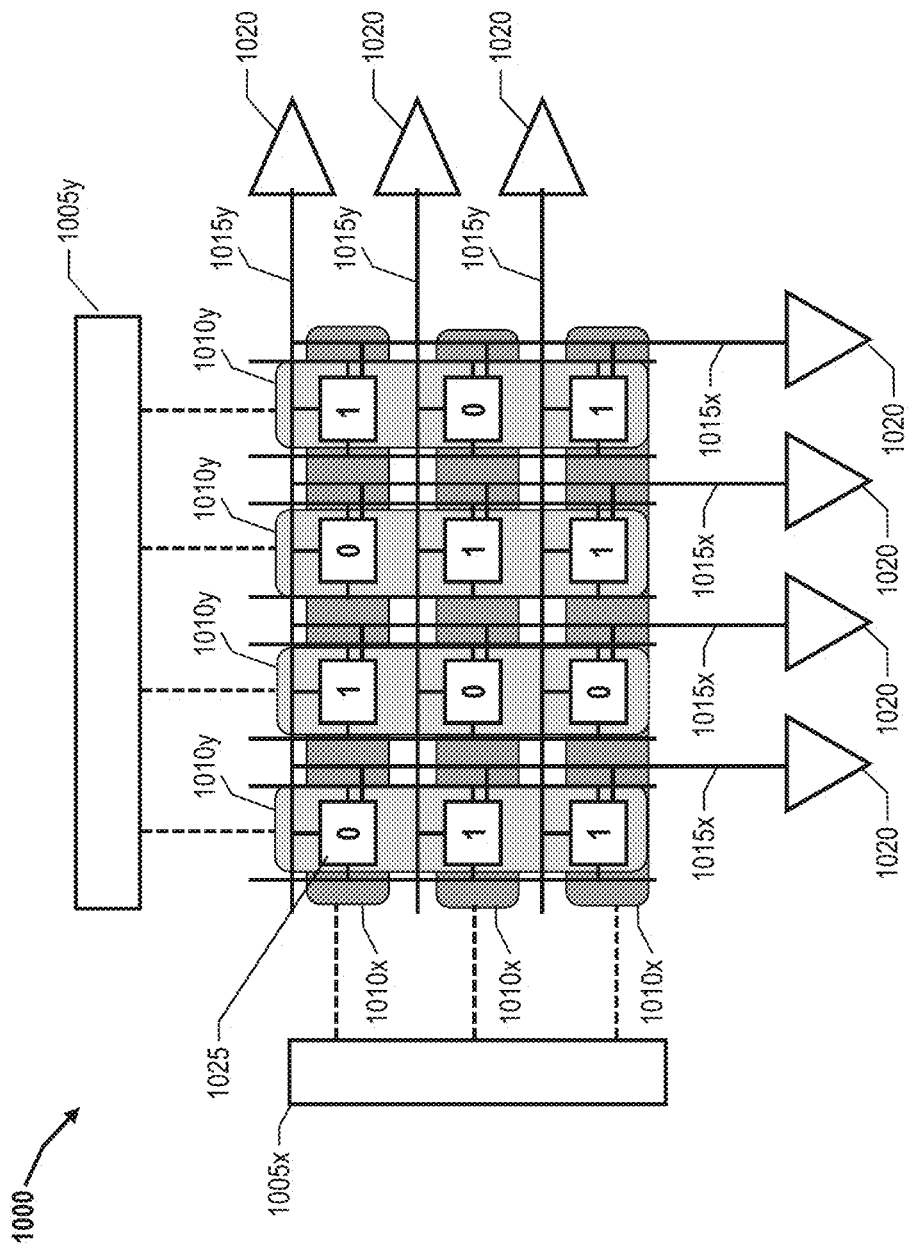
FIG. 10 shows an exemplary data compare plane that performs two-dimensional (2D) matching in accordance with aspects of the invention.

FIG. 10 shows an exemplary data compare plane 1000 that performs 2D matching in accordance with aspects of the invention. The data compare plane 1000 includes input registers 1005x and 1005y, search lines 1010x and 1010y, match lines 1015x and 1015y, sense amplifiers 1020, and an array of comparison cells 1025, which may be the same as those already described herein. The input register 1005x and the input register 1005y include respective words of search data that are compared to reference data applied to the array of comparison cells 1025. The operation of the data compare plane 1000 is similar to that already described herein. However, in the present embodiment, the data compare plane 1000 performs a 2D comparison of search data and reference data. That is, the word of search data in the input register 1005x is applied to the array of comparison cells 1025 by the search lines 1010x and results develop on match lines 1015x. In parallel, the word of search data in the input register 1005y is applied to the array of comparison cells 1025 by the search lines 1010y and results develop on match lines 1015y. The search data applied to the input registers 1005x and 1005y can be the same word. The comparison cells 1025 can be BCAM cells or TCAM cells.

Thus, in accordance with aspects of the invention, the data compare plane 1000 enables a CAM search engine (e.g., CAM search engine 800) to perform a 2D search operation with a parallel data load of reference data from a memory stack (e.g., memory stack 510). 2D search operations can be used in, for example, image recognition, 2D pattern matching, data graph analysis, and data compression.

Figure 11:
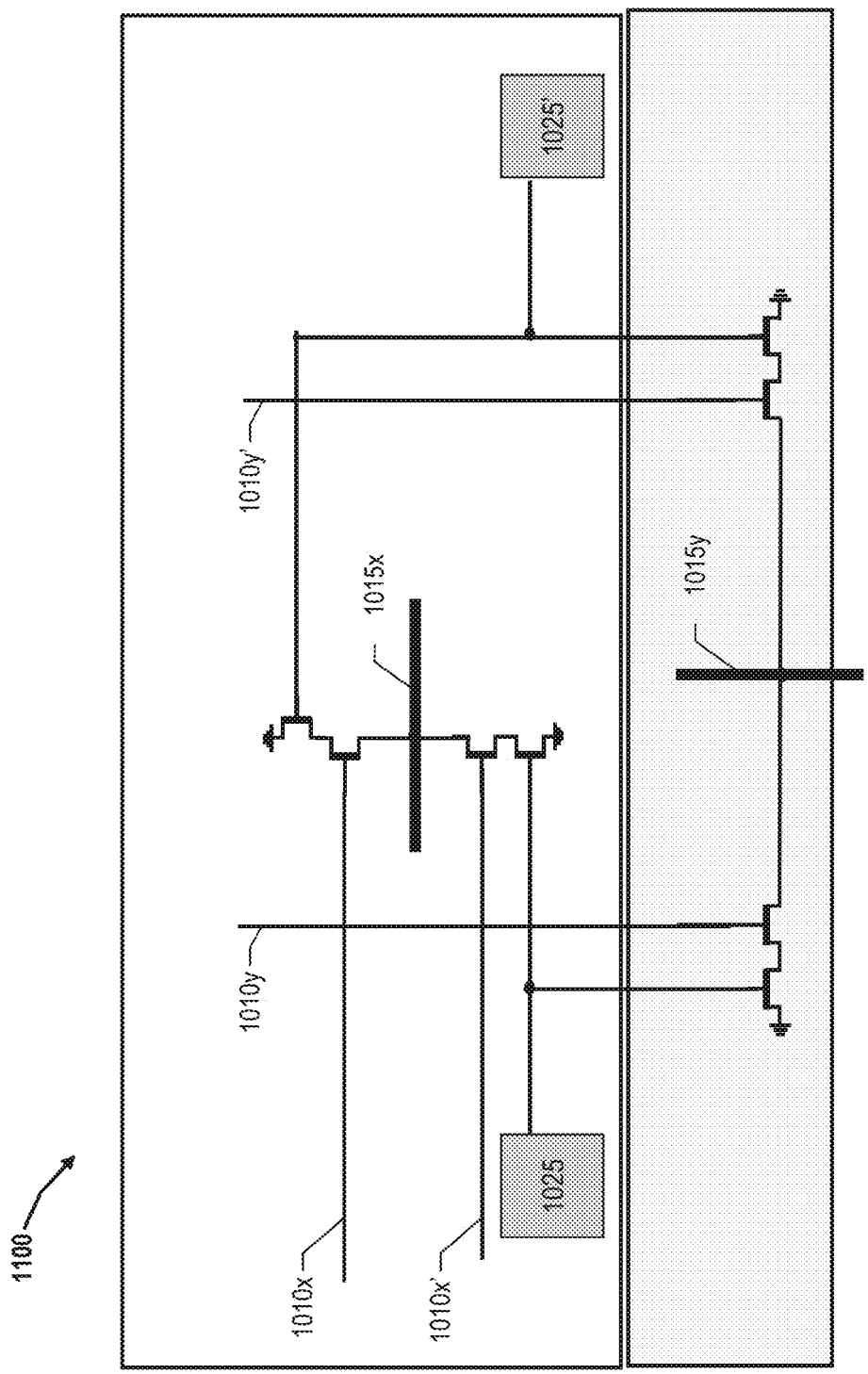
FIG. 11 shows an exemplary binary CAM bit-compare circuit that performs 2D matching in accordance with aspects of the invention.

FIG. 11 shows an exemplary TCAM bit compare circuit 1100 that performs 2D matching in accordance with aspects of the invention. TCAM bit compare circuit 1100 includes pairs of search lines 1010x/1010x' and 1010y/1010y', match lines 1015x and 1015y, sense amplifiers 1020, and pairs comparison cells 1025/1025', which may be the same as those already described herein. Reference data (e.g., from memory stack 510) is applied to the comparison cells 1025/1025'. The search lines 1010x/1010x' apply first search data (e.g., from input register 1005x) to the comparison cells 1025/1025', respectively. A corresponding first result indicating whether there is a match between the first search data and the reference data on the pairs of comparison cells 1025/1025' develops on the match line 1015x. Simultaneously, the search lines 1010y/1010y' apply second search data (e.g., from input register 1005y) to the comparison cells 1025/1025', respectively. A corresponding second result indicating whether there is a match between the second search data and the reference data on the pairs of comparison cells 1025/1025 develops on the match line 1015y.

Figure 12:
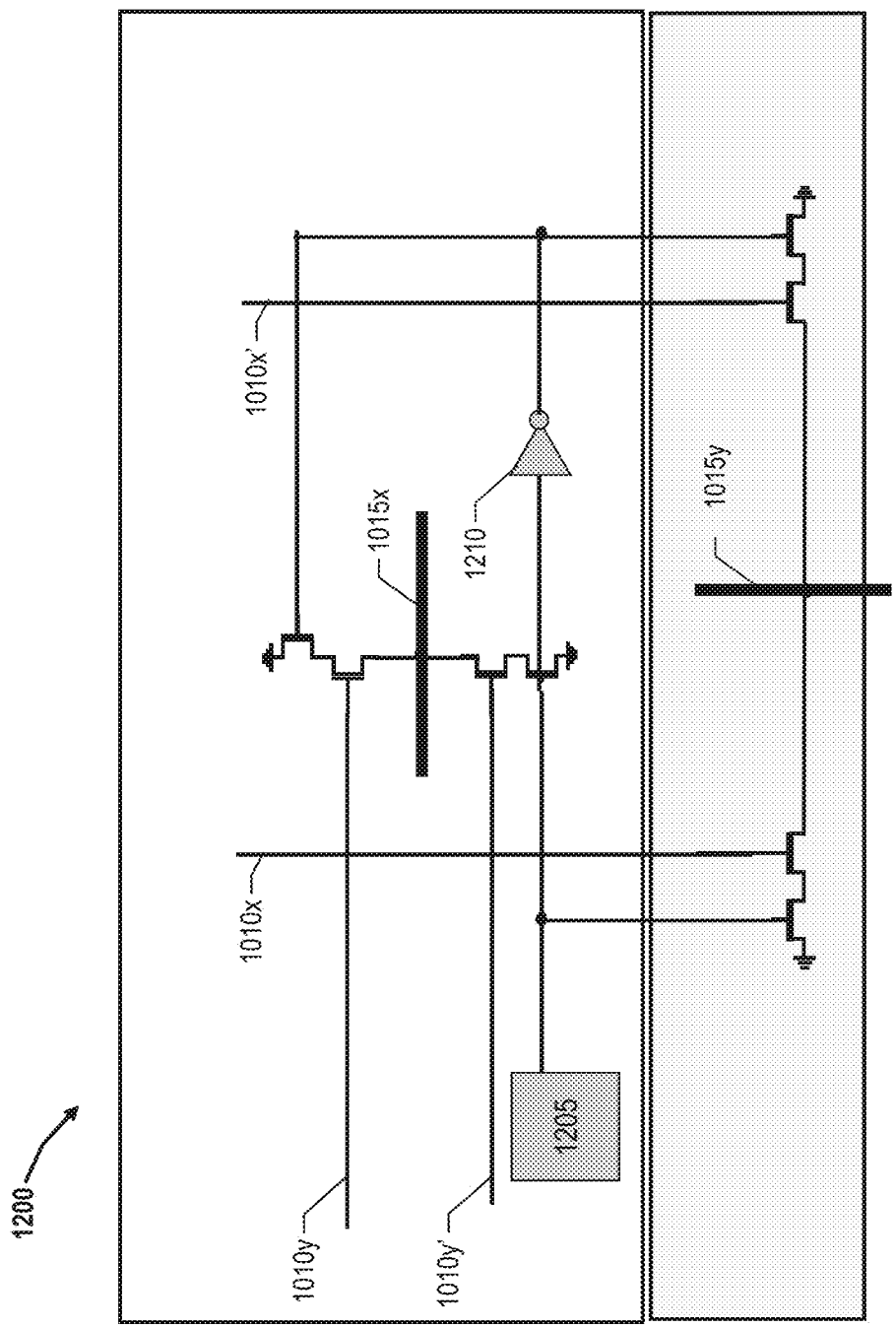
FIG. 12 shows an exemplary ternary CAM bit-compare circuit that performs 2D matching in accordance with aspects of the invention.

FIG. 12 shows an exemplary BCAM bit compare circuit 1200 that performs 2D matching in accordance with aspects of the invention. The BCAM bit compare circuit 1200 includes pairs of search lines 1010x/1010x' and 1010y/1010y', match lines 1015x and 1015y, sense amplifiers 1020, which may be the same as those already described herein. Because the BCAM bit compare circuit 1200 is binary implementation, it includes a comparison cell 1205 and an inverter 1210. The comparison cell 1205 may be the same as those described previously. The inverter 1210 generates a compliment of the value in the comparison cell 1205. Thus BCAM bit compare circuit includes a single comparison cell 1205 rather than pairs of comparison cells (e.g., comparison cells 1025/1025'). Reference data (e.g., from memory stack 510) is applied to the comparison cell 1205 and the inverter 1210. As discussed previously, the reference data can have two states, including a high state (i.e., 1/0) and a low state (i.e., 0/1), and a wildcard state (i.e., 0/0). The search lines 1010x/1010x' apply first search data (e.g., from input register 1005x) to comparison cell 1205 and the inverter 1210, respectively. A corresponding first result indicating whether there is a match between the first search data and the reference data on the pairs of comparison cell 1205 and the inverter 1210 develops on the match line 1015x. Simultaneously, search lines 1010y/1010y' apply a second search data (e.g., from input register 1005y) to comparison cell 1205 and the inverter 1210, respectively. A corresponding second result indicating a whether there is a match between the second search data and reference data on the pairs of comparison cell 1205 and the inverter 1210 develops on the match line 1015y.

Figure 13:
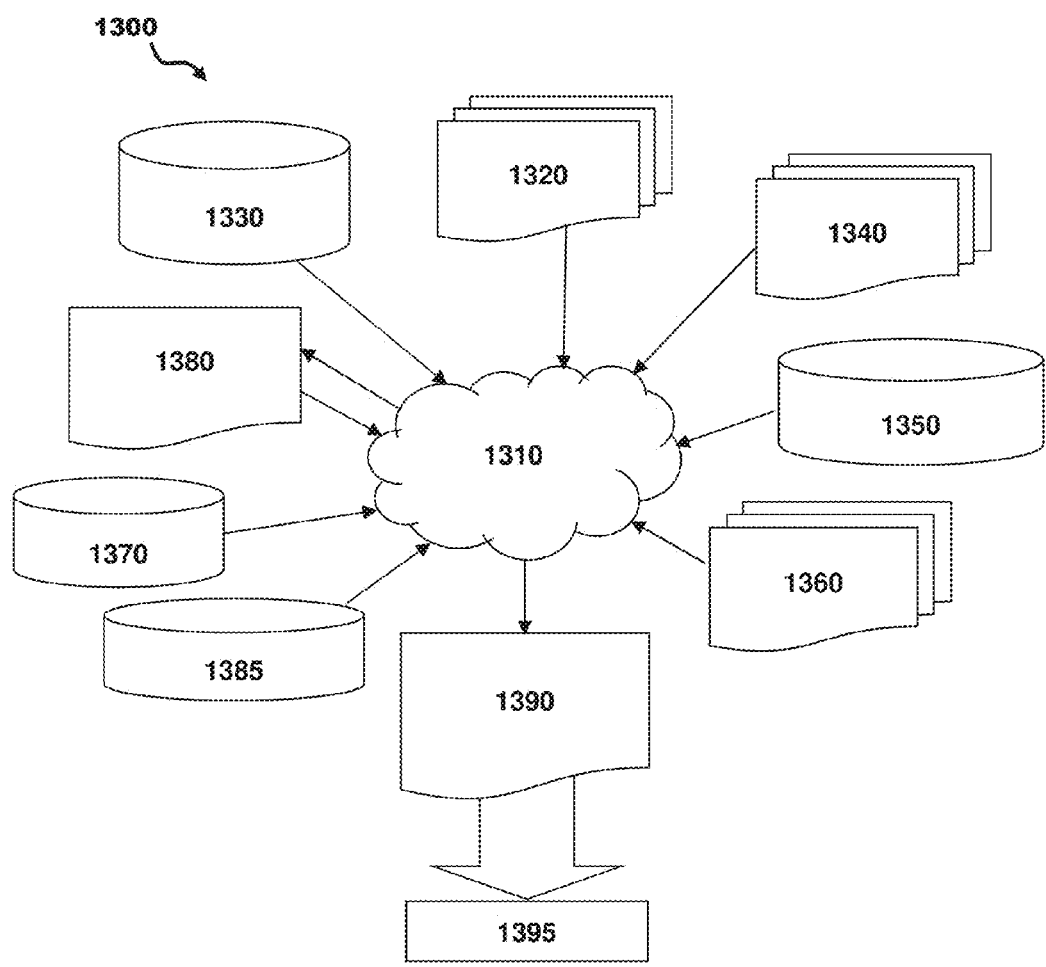
FIG. 13 shows a flow diagram of a design process used in semiconductor design, manufacture, and/or test.

FIG. 13 is a flow diagram of a design process used in semiconductor design, manufacture, and/or test. FIG. 13 shows a block diagram of an exemplary design flow 1300 used for example, in semiconductor IC logic design, simulation, test, layout, and manufacture. Design flow 1300 includes processes, machines and/or mechanisms for processing design structures or devices to generate logically or otherwise functionally equivalent representations of the design structures and/or devices described above and shown in FIGS. 5-8B and 10-12. The design structures processed and/or generated by design flow 1300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 1300 may modify depending on the type of representation being designed. For example, a design flow 1300 for building an application specific IC (ASIC) may differ from a design flow 1300 for designing a standard component or from a design flow 1300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 1320 that is preferably processed by a design process 1310. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a machine-readable data transmission, gate array, or storage medium, design structure 1320 may be accessed and processed by one or more hardware and/or software modules within design process 1310 to simulate or otherwise functionally represent an electronic component, circuit, electronic or logic module, apparatus, device, or system such as those shown in FIGS. 5-8B and 10-12. As such, design structure 1320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of the components, circuits, devices, or logic structures shown in FIGS. 5-8B and 10-12 to generate a netlist 1380 which may contain design structures such as design structure 1320. Netlist 1380 may comprise, for example, compiled or otherwise processed data structures representing a list of wires, discrete components, logic gates, control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1310 may include hardware and software modules for processing a variety of input data structure types including netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1340, characterization data 1350, verification data 1370, design rules 1370, and test data files 1385 which may include input test patterns, output test results, and other testing information. Design process 1310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1310 without deviating from the scope and spirit of the invention. Design process 1310 may also include modules for performing standard circuit design processes such as timing analysis, verification, design rule checking, place and route operations, etc.

Design process 1310 employs and incorporates logic and physical design tools such as HDL compilers and simulation model build tools to process design structure 1320 together with some or all of the depicted supporting data structures along with any additional mechanical design or data (if applicable), to generate a second design structure 1390.

Design structure 1390 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1320, design structure 1390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5-8B and 10-12. In one embodiment, design structure 1390 may comprise a compiled, executable HDL simulation model that functionally simulates the devices shown in FIGS. 5-8B and 10-12.

Design structure 1390 may also employ a data format used for the exchange of layout data of integrated circuits and/or symbolic data format (e.g. information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5-8B and 10-12. Design structure 1390 may then proceed to a stage 1395 where, for example, design structure 1390: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A content-addressable memory (CAM) search engine comprising:
    a data compare plane comprising a content addressable memory die including an array of comparison cells; and
    a memory stack on the data compare plane, the memory stack comprising a plurality of stacked memory dies including one or more memory banks,
    wherein:
        the array of comparison cells comprise a plurality of parallel interconnects,
        the plurality of parallel interconnects electrically connect to outputs of the one or more memory banks; and
        the comparison cells are time-shared among the one or more memory banks.

2. The CAM search engine of claim 1, wherein the CAM search engine provides reference data in a serial fashion from the one or more memory banks via the plurality of parallel interconnects and applies the reference data to search data at the comparison cells.

3. The CAM search engine of claim 1, wherein the plurality of parallel interconnects are through-silicon vias (TSVs).

4. The CAM search engine of claim 1, further comprising a data formatting plane comprising a die between the memory stack and the data compare plane, the data formatting plane comprises a plurality of parallel die interconnects electrically connected to respective ones of the plurality of parallel interconnects of the comparison cells.

5. The CAM search engine of claim 4, wherein the plurality of parallel die interconnects are an array of die interconnects vertically aligned with the parallel interconnects of the comparison cells.

6. The CAM search engine of claim 1, wherein the data compare plane is a ternary CAM.

7. The CAM search engine of claim 6, wherein the ternary CAM is an algorithmic CAM.

8. The CAM search engine of claim 1, wherein the data compare plane is a two-dimensional binary CAM.

9. The CAM search engine of claim 1, wherein the data compare plane is a two-dimensional ternary CAM.

10. The CAM search engine of claim 1, further comprising a match compare plane stacked with the data compare plane, the match compare plane including a data storage device that stores search results output by the data compare plane.

11. A method comprising:
    providing a subset of reference data selected from reference data stored in a memory stack onto an array of parallel vertical interconnects of a data compare plane;
    applying search data to the subset of reference data on the vertical interconnects via search lines of the data compare plane;
    reading results of the applied search data to the subset of reference data from match lines of the data compare plane; and
    storing one or more of the results in a match analysis plane.

12. The method of claim 11, wherein the providing the subset of reference data comprises retrieving the subset of reference data from a plurality of memory banks in the memory stack.

13. The method of claim 11, wherein the providing the subset of reference data comprises streaming the subset of reference data to the data compare plane.

14. The method of claim 13, wherein the streaming comprise burst mode transmissions.

15. The method of claim 11, wherein the providing the subset of reference data comprises providing the subset of reference data to the data compare plane through parallel vertical die interconnects of a data formatting plane.

16. The method of claim 15, wherein the providing the selected reference data further comprises providing the subset of reference data from the parallel vertical die interconnects of the data formatting plane to the array of parallel vertical interconnects of the data compare plane.

17. The method of claim 11, wherein the providing, the applying, the reading, and the storing steps are iteratively repeated using different subsets of the reference data stored in the memory stack.

18. The method of claim 11, wherein the subset of reference data is determined from search results from a previous step of applying prior search data to a prior subset of the reference data.

19. A stacked, three-dimensional content-addressable memory (CAM) search engine comprising:
    a memory stack comprising memory dies including a plurality of memory banks; and
    a data comparison die comprising a plurality of search lines, a plurality of match lines and an array of comparison cells, wherein:
  the comparison cells comprise an array of vertical interconnects electrically connected to respective outputs of the memory stack,
  the plurality of search lines connect the comparison cells in columns to an input register, and
  the plurality of match lines connect the comparison cells in rows to outputs.

20. The CAM search engine of claim 19, wherein the data comparison die comprises a ternary CAM.

* * * * *